United States Patent
Kim et al.

(10) Patent No.: US 9,130,153 B2
(45) Date of Patent: Sep. 8, 2015

(54) SEMICONDUCTOR DEVICE AND ELECTRONIC DEVICE INCLUDING THE SAME

(71) Applicant: SK HYNIX INC., Icheon (KR)

(72) Inventors: Beom-Yong Kim, Icheon (KR); Kee-Jeung Lee, Icheon (KR); Wan-Gee Kim, Icheon (KR); Hyo-June Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 76 days.

(21) Appl. No.: 13/946,894

(22) Filed: Jul. 19, 2013

(65) Prior Publication Data

US 2014/0301127 A1 Oct. 9, 2014

(30) Foreign Application Priority Data

Apr. 5, 2013 (KR) .................. 10-2013-0037371

(51) Int. Cl.
*H01L 45/00* (2006.01)
*G11C 13/00* (2006.01)
*H01L 27/24* (2006.01)

(52) U.S. Cl.
CPC .......... *H01L 45/085* (2013.01); *G11C 13/0004* (2013.01); *G11C 13/0007* (2013.01); *H01L 27/2463* (2013.01); *H01L 45/06* (2013.01); *H01L 45/08* (2013.01); *H01L 45/1233* (2013.01); *H01L 45/1293* (2013.01); *H01L 45/144* (2013.01); *H01L 45/146* (2013.01); *H01L 45/147* (2013.01); *G11C 2213/55* (2013.01)

(58) Field of Classification Search
CPC ....... H01L 45/06; H01L 45/08; H01L 45/085; H01L 45/1233; H01L 45/1293; G11C 13/0004; G11C 13/0007
USPC .................................. 257/1, 2, 3, 4
See application file for complete search history.

(56) References Cited

U.S. PATENT DOCUMENTS

| | | | | |
|---|---|---|---|---|
| 6,972,429 | B1* | 12/2005 | Hsueh et al. | 257/3 |
| 2010/0308298 | A1* | 12/2010 | Ninomiya et al. | 257/5 |
| 2011/0133152 | A1* | 6/2011 | Choi | 257/4 |
| 2013/0026438 | A1* | 1/2013 | Wang et al. | 257/4 |

FOREIGN PATENT DOCUMENTS

KR 10-0785032 B1 12/2007
KR 10-2008-0112878 A 12/2008

* cited by examiner

*Primary Examiner* — Long K Tran

(57) ABSTRACT

A semiconductor device includes a first conductive layer, a second conductive layer spaced from the first conductive layer, a variable resistance layer interposed between the first and second conductive layers, and an impurity-doped layer provided over a side surface of the variable resistance layer. The variable resistance layer has a smaller width than the first and the second conductive layers.

13 Claims, 12 Drawing Sheets

FIG. 8C
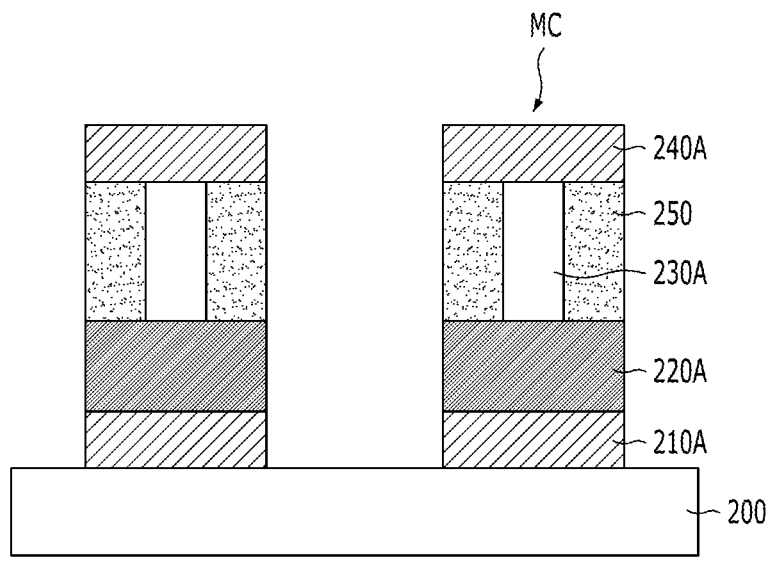
FIG. 9A         FIG. 9B
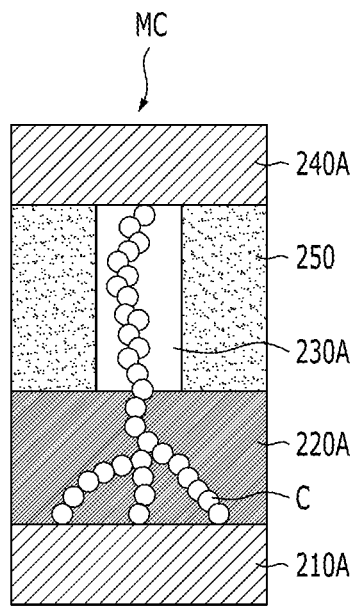 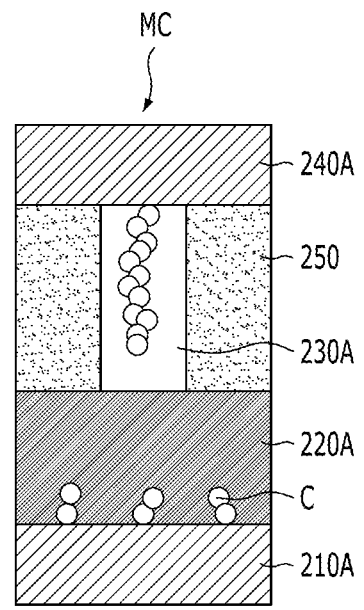

SEMICONDUCTOR DEVICE AND ELECTRONIC DEVICE INCLUDING THE SAME

CROSS-REFERENCE TO RELATED APPLICATION

The present application claims priority Korean Patent Application No. 10-2013-0037371, filed on Apr. 5, 2013, which is incorporated by reference herein in its entirety.

BACKGROUND

1. Field

Exemplary embodiments relate to a semiconductor device and an electronic device including the same, and more particularly, to a semiconductor device including a variable resistance layer which is capable of switching between two different resistance states in response to an applied voltage or current, and an electronic device including the same.

2. Description of the Related Art

A variable resistance memory device, of which the resistance changes according to an external stimulus, switches between two or more resistance states so as to store data, and includes a resistive random access memory (ReRAM), a phase change RAM (PCRAM), a spin transfer torque-RAM (STT-RAM) and the like. In particular, the variable resistance memory device may have a simple structure and have a variety of excellent characteristics such as nonvolatility. Thus, extensive research has been conducted on the variable resistance memory device.

FIG. 1 is a cross-sectional view of a conventional semiconductor device.

Referring to FIG. 1, a ReRAM of variable resistance memory devices has a structure in which a variable resistance layer 20 is interposed between first and second electrodes 10 and 30. The variable resistance layer 20 may include a perovskite-based material or transition metal oxide (TMO) of which electric resistance is changed by migration of oxygen vacancies or ions.

FIGS. 2A to 2D are cross-sectional views for explaining the switching mechanism of the conventional semiconductor device.

Referring to FIG. 2A, when a forming voltage is applied to the variable resistance layer 20 through the first and second electrodes 10 and 30, a filament-shaped current path C which is formed by migration or rearrangement of oxygen vacancies or ions is initially generated in the variable resistance layer 20. Then, the variable resistance layer 20 may be set in a low resistance state (LRS).

Referring to FIG. 2B, when a reset voltage is applied to the variable resistance layer 20 through the first and the second electrodes 10 and 30, the current path C formed in the variable resistance layer 20 is cut off. Then, the variable resistance layer 20 may be set in a high resistance state (HRS).

Referring to FIG. 2C, when a set voltage is applied to the variable resistance layer 20 through the first and the second electrodes 10 and 30, a current path C is regenerated in the variable resistance layer 20. Then, the variable resistance layer 20 may be set in the LRS. At this time, since oxygen vacancies or ions forming the current path C are non-uniformly distributed, the current path C is randomly generated.

Referring to FIG. 2D, when the reset voltage is applied to the variable resistance layer 20 through the first and the second electrodes 10 and 30, the variable resistance layer 20 is set in the HRS. Then, when the set voltage is applied again, a current path C is regenerated in the variable resistance layer 20, and the variable resistance layer 20 may be set in the LRS. As described above, however, the current path C is randomly generated. In other words, it may be difficult to regenerate the current path C at a specific location of the variable resistance layer 20. Thus, although the same set voltage is applied to the variable resistance layer 20 on multiple occasions, the positions and numbers of the current path C formed in the variable resistance layer 20 may be different in every occasion. Therefore, the resistance switching characteristics may become non-uniform even when the set voltage/current and the reset voltage/current are applied at constant levels. As a result, the durability and reliability of the semiconductor device may be reduced.

SUMMARY

Various embodiments are directed to a semiconductor device in which impurities are implanted into sidewalls of a variable resistance layer to limit an area where a current path is generated, and one or few current paths are generated in the variable resistance layer such that resistance switching characteristics are uniform and nonlinearity and operation speed are improved, and an electronic device including the same.

In an embodiment, a semiconductor device includes: a first conductive layer; a second conductive layer spaced from the first conductive layer; a variable resistance layer provided between the first conductive layer and the second conductive layer; and an impurity-doped layer provided over a side surface of the variable resistance layer, wherein the variable resistance layer has a smaller width than a width of the first conductive layer and a width of the second conductive layer.

In an embodiment, a semiconductor device includes: a first conductive layer; a second conductive layer spaced from the first conductive layer; first and second metal oxide layers provided between the first and the second conductive layers; and an impurity-doped layer provided over a sidewall of the second metal oxide layer, wherein a width of the second metal oxide layer is smaller width than a width of the first metal oxide layer.

In an embodiment, an electronic device includes: a variable resistance memory device configured to store data and maintain the stored data regardless of power supply; and a memory controller configured to control input/output of the data stored in the variable resistance memory device according to a command inputted from outside, wherein the variable resistance memory device comprises: a first conductive layer; a second conductive layer spaced from the first conductive layer; a variable resistance layer provided between the first conductive layer and the second conductive layer; and an impurity-doped layer provided over a side surface of the variable resistance layer, and wherein a width of the variable resistance layer is smaller than a width of the first conductive layer and a width of the second conductive layer.

BRIEF DESCRIPTION OF THE DRAWINGS

FIGS. 8A to 8C are cross-sectional views for explaining a semiconductor device and a method for fabricating the same in accordance with a fifth embodiment.

FIGS. 9A and 9B are cross-sectional views for explaining the switching mechanism of the semiconductor device in accordance with the fifth embodiment.

DETAILED DESCRIPTION

Figure 1:
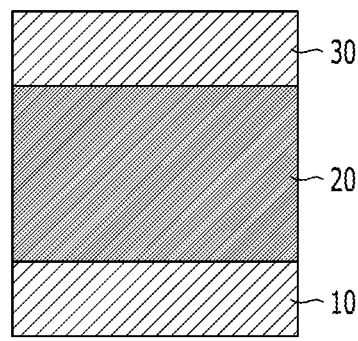
FIG. 1 is a cross-sectional view of a conventional semiconductor device.
Figure 2A:
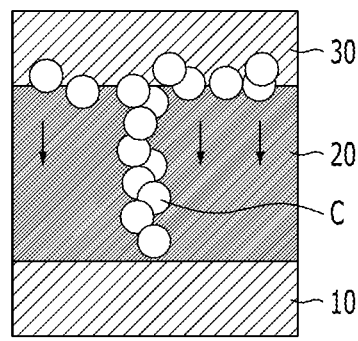
FIGS. 2A to 2D are cross-sectional views for explaining the switching mechanism of the conventional semiconductor device.
Figure 2B:
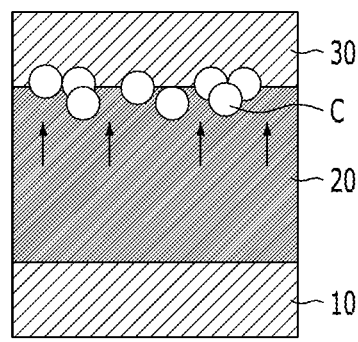
Figure 2C:
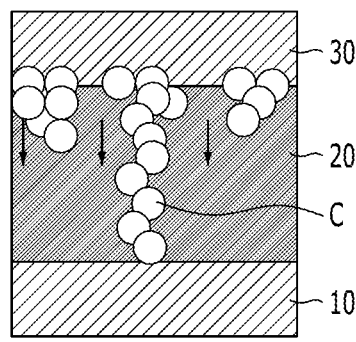
Figure 2D:
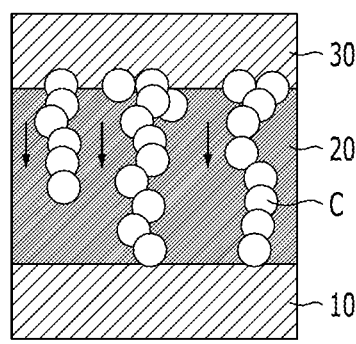

Various embodiments will be described below in more detail with reference to the accompanying drawings. The embodiments may, however, be realized in different forms and should not be construed limiting. Throughout the disclosure, like reference numerals refer to like parts or elements throughout the various figures and embodiments.

The drawings are not necessarily to scale. Rather, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also refers to a case where a third layer exists between the first layer and the second layer or the substrate.

Figure 3A:
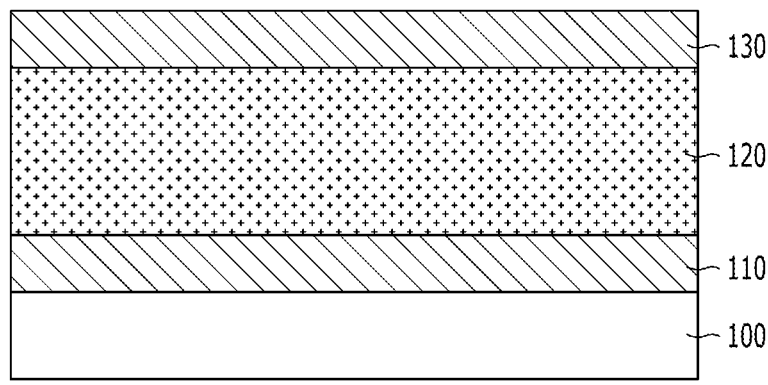
FIGS. 3A to 3C are cross-sectional views for explaining a semiconductor device and a method for fabricating the same in accordance with a first embodiment.
Figure 3B:
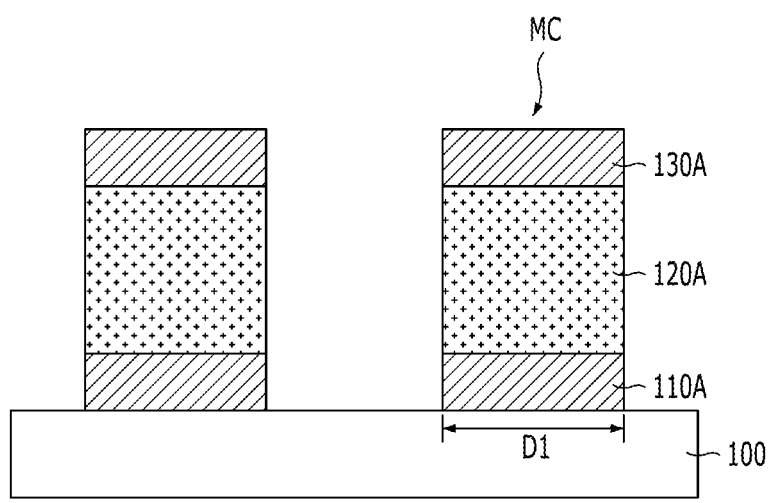
Figure 3C:
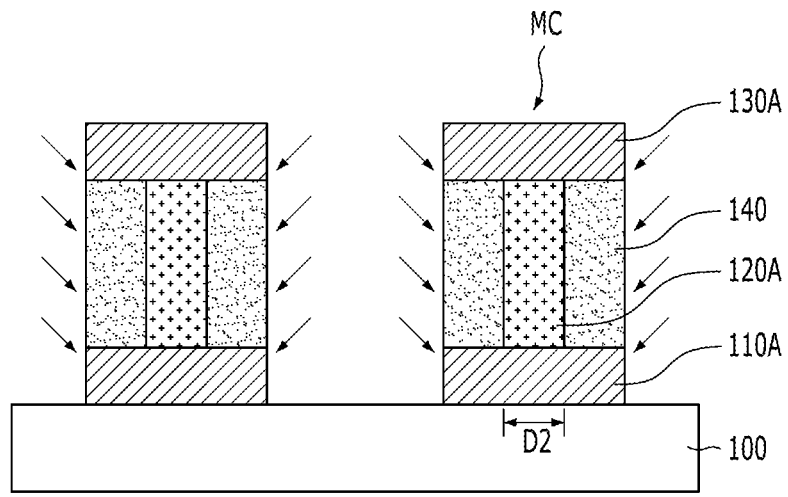

FIGS. 3A to 3C are cross-sectional views for explaining a semiconductor device and a method for fabricating the same in accordance with a first embodiment. In particular, FIG. 3C is a cross-sectional view of the semiconductor device in accordance with the first embodiment, and FIGS. 3A and 3B are cross-sectional views illustrating processes for fabricating the device of FIG. 3C.

Referring to FIG. 3A, a first conductive layer 110, a variable resistance layer 120, and a second conductive layer 130 are sequentially formed over a substrate 100 having a predetermined lower structure (not illustrated). The substrate 100 may include a silicon (Si) substrate, a germanium (Ge) substrate, a silicon-germanium (SiGe) substrate, and/or a silicon-on-insulator (SOI) substrate. Although not illustrated in FIG. 3A, the substrate 100 may include peripheral circuit elements for driving the semiconductor device.

The first and the second conductive layer 110 and 130 may include a conductive material, for example, (i) a metal nitride such as titanium nitride (TiN), tantalum nitride (TaN), titanium aluminum nitride (TiAlN), or tungsten nitride (WN), (ii) a metal such as tungsten (W), aluminum (Al), copper (Cu), gold (Au), silver (Ag), platinum (Pt), nickel (Ni), chrome (Cr), cobalt (Co), titanium (Ti), ruthenium (Ru), hafnium (Hf), or zirconium (Zr), and/or (iii) doped silicon. The variable resistance layer 120 may include (i) a material of which electric resistance is changeable by migration of oxygen vacancies or ions, and/or (ii) a material of which electric resistance is changeable by phase change.

The material of which electric resistance is changed by migration of oxygen vacancies or ions, may include (i) a perovskite-based material such as $SrTiO_3$(STO), $BaTiO_3$ (BTO), and $Pr_{1-x}Ca_xMnO_3$(PCMO) (x is a rational number) and/or (ii) a transition metal oxide (TMO) such as titanium oxide ($TiO_2$, $Ti_4O_7$), hafnium oxide ($HfO_2$), zirconium oxide ($ZrO_2$), aluminum oxide ($Al_2O_3$), tantalum oxide ($Ta_2O_5$), niobium oxide ($Nb_2O_5$), cobalt oxide ($Co_3O_4$), nickel oxide (NiO), tungsten oxide ($WO_3$), and/or lanthanum oxide ($La_2O_5$). The material of which electric resistance is changed by phase change may include a material which may be switched between a crystalline state and an amorphous state by heat, for example, a chalcogenide-based material such as GST (GeSbTe) in which germanium, antimony, and tellurium are mixed at a predetermined ratio.

Referring to FIG. 3B, the first conductive layer 110, the variable resistance layer 120, and the second conductive layer 130 are selectively etched to form a pillar-shaped memory cell MC in which a first conductive layer pattern 110A, a variable resistance layer pattern 120A, and a second conductive layer pattern 130A are sequentially stacked. A plurality of memory cells MC may be arranged in a matrix when seen from the top of the substrate 100, and may have a width D1 substantially equal to a given critical dimension (CD; a minimum pattern size obtainable under a given process conditions).

Referring to FIG. 3C, impurities are implanted into sidewalls of the variable resistance layer pattern 120A through a tilted ion-implant process so as to convert an outer portion of the variable resistance layer pattern 120A into an impurity-doped layer 140. The implanted impurities may include one or more of Si and Ge. Heat treatment may be additionally performed to locate the impurities in crystalline lattices of the variable resistance layer pattern 120A. As a result of this process, a width of the variable resistance layer pattern 120A is reduced from D1 (refer to FIG. 3B) to D2, and the width D2 of the variable resistance layer pattern 120A may be smaller than the given CD. The width D2 of the variable resistance layer pattern 120A may be adjusted according to the ion implant energy and dose employed. During the process, the impurities may be slightly implanted into the first and the second conductive layer patterns 110A and 130A.

When Si is implanted into the variable resistance layer pattern 120A including a perovskite-based material or TMO of which electric resistance is changed by migration of oxygen vacancies or ions, silicate may be formed in the impurity-doped layer 140. Since the silicate formed in the impurity-doped layer 140 has insulating properties, a filament-shaped current path composed of oxygen vacancies or ions is not generated in the impurity-doped layer 140.

When Si is implanted into the variable resistance layer pattern 120A including a chalcogenide-based material of which electric resistance is changed by phase change, silicide may be formed in the impurity-doped layer 140. Since the silicide formed in the impurity-doped layer 140 has higher heat resistance than the variable resistance layer pattern 120A, the silicide may effectively suppress heat within the variable resistance layer pattern 120A from being dissipated to the outside. Thus, a current required for changing the phase of the variable resistance layer pattern 120A decreases.

Through the above-described fabrication method, the semiconductor device of FIG. 3C in accordance with the embodiment may be fabricated.

Referring to FIG. 3C, the semiconductor device in accordance with the first embodiment may include the first conductive layer pattern 110A over the substrate 100, the second conductive layer pattern 130A spaced from the first conductive layer pattern 110A, the variable resistance layer pattern 120A interposed between the first and second conductive layer patterns 110A and 130A, and the impurity-doped layer 140 surrounding side surfaces of the variable resistance layer pattern 120A.

The impurity-doped layer 140, which is doped with one or more of Si and Ge, has a higher resistance value than the variable resistance layer pattern 120A, and may include silicate or silicide. The variable resistance layer pattern 120A may include a material of which electric resistance is changed by migration of oxygen vacancies or ions or a material of which electric resistance is changed by phase change. The width D2 of the variable resistance layer pattern 120A is smaller than the width D1 of the first and second conductive layer patterns 110A and 130A (refer to FIG. 3B). Thus, the impurity-doped layer 140 may be interposed between the first and second conductive layer patterns 110A and 130A.

Figure 4:
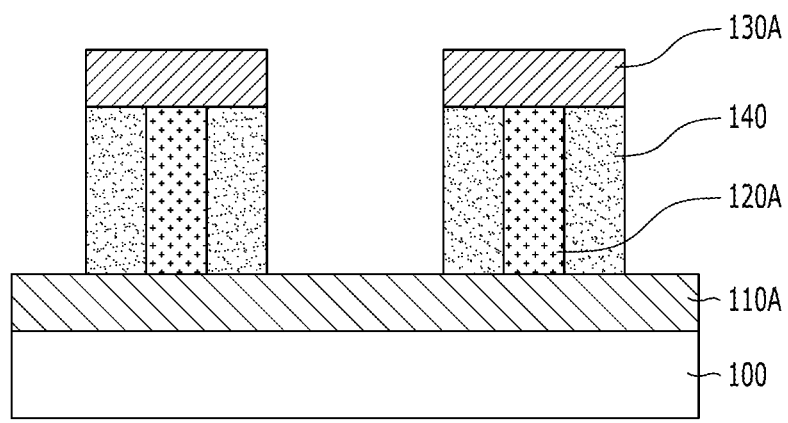
FIGS. 4 and 5 are cross-sectional views of semiconductor devices in accordance with second and third embodiments.
Figure 5:
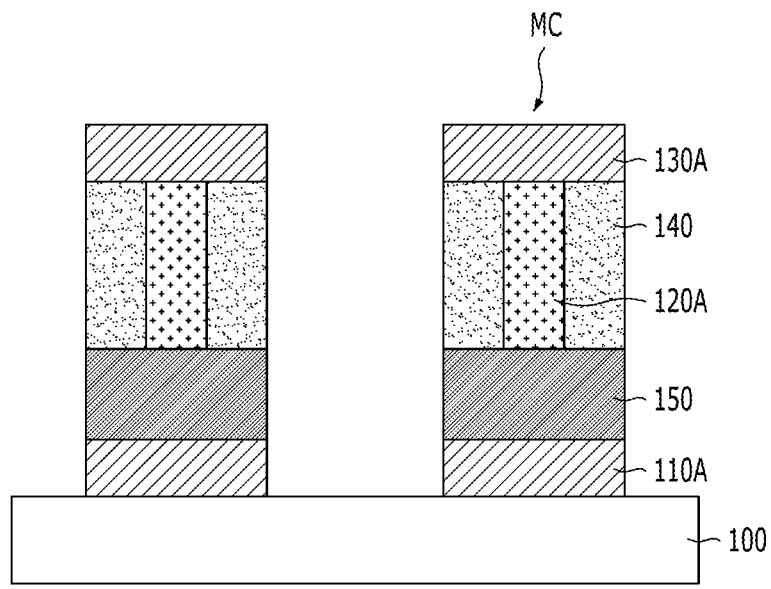

FIGS. 4 and 5 are cross-sectional views of semiconductor devices in accordance with second and third embodiments. In these embodiments, the detailed descriptions of substantially the same portions as those of the first embodiment are omitted herein.

Referring to FIG. 4, first conductive layer patterns 110A of the semiconductor device in accordance with the second embodiment may be extended in parallel to each other in a first direction, and second conductive layer patterns 130A may be extended in parallel to each other in a second direction crossing the first direction and the conductive layer patterns 110A. At each of the intersections between the first and second conductive layer patterns 110A and 130A, the variable resistance layer pattern 120A and the impurity-doped layer 140 surrounding side surfaces of the variable resistance layer pattern 120A may be arranged.

Referring to FIG. 5, a selecting element layer 150 may be interposed between the first conductive layer pattern 110A and the variable resistance layer pattern 120A of the semiconductor device in accordance with the third embodiment. The selecting element layer 150 may include a transistor which may be turned on/off or a diode which is configured to pass a current only in one direction. In addition, the selecting element layer 150 may include an asymmetrical tunnel barrier having a nonlinear current-voltage characteristic, a metal-insulator transition (MIT) element which undergoes a transition from an insulator to a metal at a specific critical temperature such that the electric resistance thereof rapidly changes, or an ovonic switching element which performs a switching operation at a specific threshold voltage. In an embodiment, the selecting element layer 150 may be interposed between the variable resistance layer pattern 120A and the second conductive layer pattern 130A.

Figure 6A:
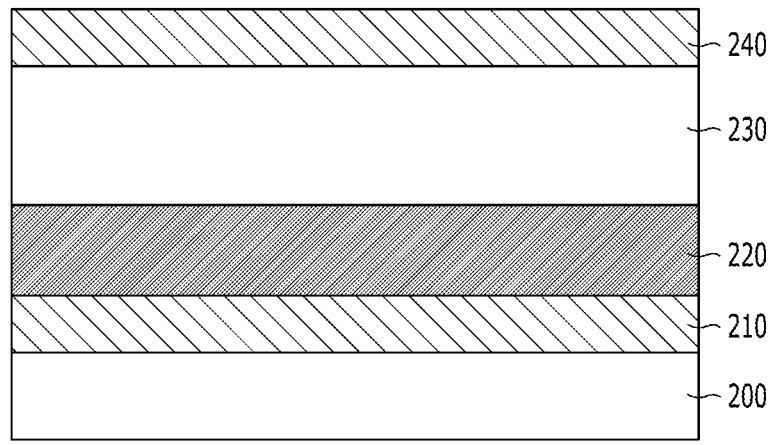
FIGS. 6A to 6C are cross-sectional views for explaining a semiconductor device and a method for fabricating the same in accordance with a fourth embodiment.
Figure 6B:
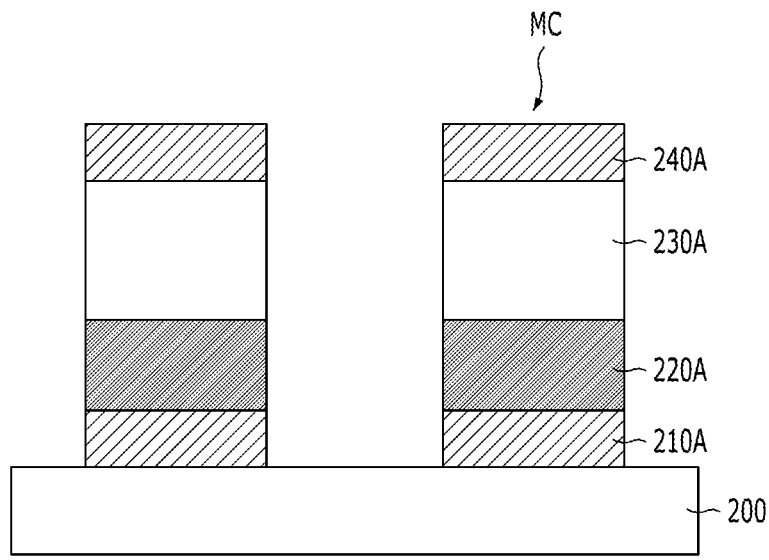
Figure 6C:
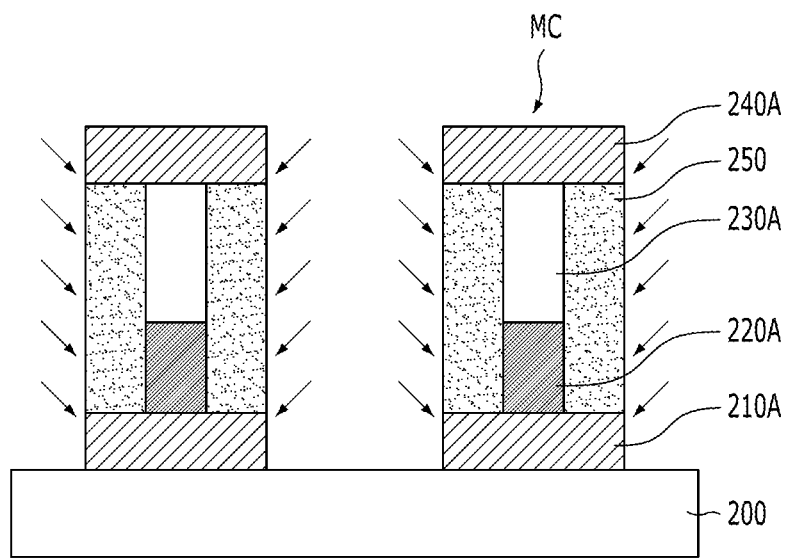

FIGS. 6A to 6C are cross-sectional views for explaining a semiconductor device and a method for fabricating the same in accordance with a fourth embodiment. In particular, FIG. 6C is a cross-sectional view of the semiconductor device in accordance with the fourth embodiment, and FIGS. 6A and 6B are cross-sectional views illustrating processes for fabricating the device of FIG. 6C. In this embodiment, the detailed descriptions of substantially the same elements as those of the first embodiment are omitted herein.

Referring to FIG. 6A, a first conductive layer 210, a first metal oxide layer 220, a second metal oxide layer 230, and a second conductive layer 240 are sequentially formed over a substrate 200 having a predetermined lower structure (not illustrated) such as a peripheral circuit element for driving the semiconductor device. The substrate 200 may include a silicon substrate, a germanium substrate, a silicon-germanium substrate, or an SOI substrate, and the first and the second conductive layers 210 and 240 may include a conductive material such as metal nitride, metal, or doped silicon.

The first and the second metal oxide layers 220 and 230 form a variable resistance layer, and may include a perovskite-based material or TMO of which electric resistance is changed by migration of oxygen vacancies or ions. In particular, the first metal oxide layer 220 in which resistance switching occurs may have a typical stoichiometric composition, and the second metal oxide layer 230 may be formed to have a an oxygen-deficient stoichiometric material whose oxygen amount is less than a stoichiometric ratio. Thus, an excess of oxygen vacancies or ions may exist in the second metal oxide layer 230.

Referring to FIG. 6B, the first conductive layer 210, the first metal oxide layer 220, the second metal oxide layer 230, and the second conductive layer 240 are selectively etched to form a pillar-shaped memory cell MC in which a first conductive layer pattern 210A, a first metal oxide layer pattern 220A, a second metal oxide layer pattern 230A, and a second conductive layer pattern 240A are sequentially stacked. At this time, a plurality of memory cells MC may be arranged in a matrix when seen from the top of the substrate 200.

Referring to FIG. 6C, impurities are implanted into sidewalls of the first and the second metal oxide layer patterns 220A and 230A through a tilted ion implant process, thereby converting the outer portions of the first and the second metal oxide layer patterns 220A and 230A into an impurity-doped layer 250. At this time, the implanted impurities may include one or more of Si and Ge, and a heat treatment may be additionally performed to locate the impurities in the crystalline lattices of the first and second metal oxide layer patterns 220A and 230A.

Through the above-described fabrication method, the semiconductor device of FIG. 6C in accordance with the fourth embodiment may be fabricated.

Referring to FIG. 6C, the semiconductor device in accordance with the fourth embodiment may include the first conductive layer pattern 210A over the substrate 200, the second conductive layer pattern 240A spaced from the first conductive layer pattern 210A, the variable resistance layer including the first and the second metal oxide layer patterns 220A and 230A interposed between the first and the second conductive layer patterns 210A and 240A, and an impurity-doped layer 250 surrounding side surfaces of the variable resistance layer.

The first and second metal oxide layer pattern 220A and 230A may include a perovskite-based material or TMO having variable resistance characteristics. The first metal oxide pattern may have a typical stoichiometric composition and the second metal oxide layer pattern 230A may include, e.g., an oxygen-deficient stoichiometric material whose oxygen amount is less than a stoichiometric ratio. The impurity-doped layer 250 may be doped with one or more of Si and Ge and may have an electrical resistance value or a thermal resistance value higher than an electrical resistance value or a thermal resistance value of the first and the second metal oxide layer patterns 220A and 230A. In particular, the impurity-doped layer 250 may have insulating properties. The first and the second metal oxide layer patterns 220A and 230A have smaller widths than the first and the second conductive layer patterns 210A and 240A. Thus, the impurity-doped layer 250 may be interposed between the first and the second conductive layer patterns 210A and 240A.

Figure 7A:
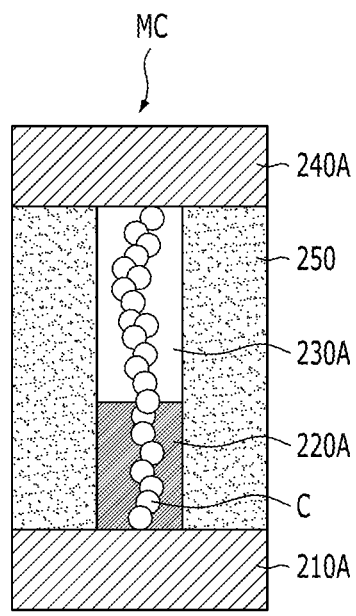
FIGS. 7A and 7B are cross-sectional views for explaining the switching mechanism of the semiconductor device in accordance with the fourth embodiment.
Figure 7B:
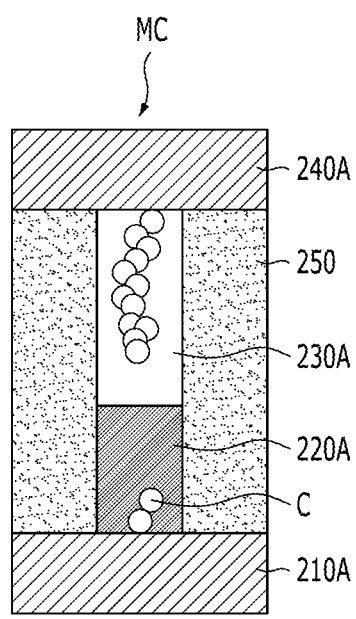

FIGS. 7A and 7B are cross-sectional views for explaining a switching mechanism of the semiconductor device in accordance with the fourth embodiment.

Referring to FIG. 7A, when a set voltage is applied to the first and the second metal oxide layer patterns 220A and 230A through the first and the second conductive layer patterns 210A and 240A, a filament-shaped current path C is generated in the first and the second metal oxide layer patterns 220A and 230A by oxygen vacancies or ions, and the memory cell MC is set to LRS. At this time, a current path C is not generated in the impurity-doped layer 250 having insulating properties, and one or a few current paths C are generated in the first and the second metal oxide layer pattern 220A and 230A of which the width is reduced by the impurity-doped layer 250. In this case, the current path C may be easily adjusted. Furthermore, as the number of current paths C generated at LRS is maintained in a subsequent switching operation, reliability of the semiconductor device may be significantly improved. Furthermore, switching characteristics among the plurality of memory cells MC may be kept uniform, which also increases reliability and performance of the semiconductor device.

Referring to FIG. 7B, when a reset voltage is applied to the first and the second metal oxide layer patterns 220A and 230A through the first and the second conductive layer patterns 210A and 240A, the current paths C generated in the first and the second metal oxide layer patterns 220A and 230A are cut off, and the memory cell MC is set to HRS. At this time, since one or a few current paths exist as described above, the current paths may be easily cut off. Thus, the switching speed of the semiconductor device may be increased, and the power consumption of the semiconductor device may be reduced. Furthermore, since the current path C is prevented from remaining at HRS, the resistance value at HRS may be further increased. In other words, a residual current in the first and the second metal oxide layer patterns 220A and 230A at HRS is relatively low compared with that of a structure having no impurity-doped layer 250. Thus, a current ratio between LRS and HRS may be increased.

Figure 8A:
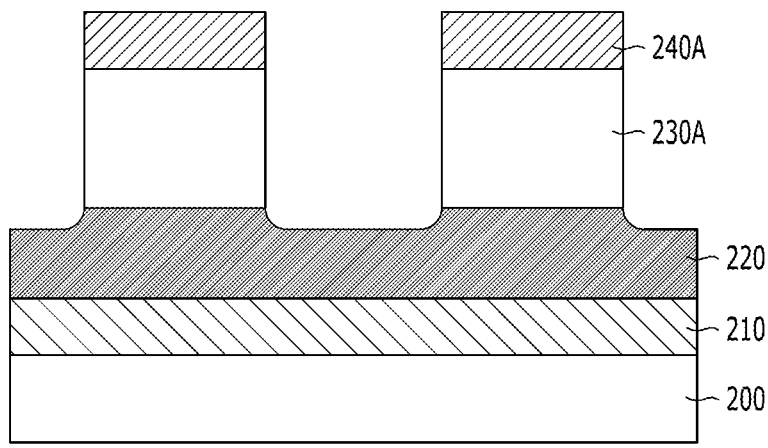
Figure 8B:
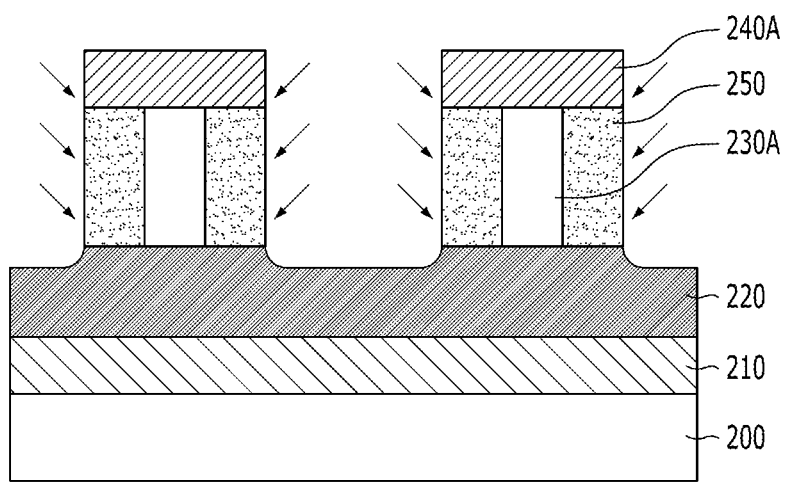

FIGS. 8A to 8C are cross-sectional views for explaining a semiconductor device and a method for fabricating the same in accordance with a fifth embodiment. FIG. 8C is a cross-sectional view of the semiconductor device in accordance with the fifth embodiment, and FIGS. 8A and 8B are cross-sectional views illustrating processes for fabricating the device of FIG. 8C. In these embodiments, the detailed descriptions on substantially the same components as those of the first embodiment are omitted herein. As in the fourth embodiment, the process shown in FIG. 6A is first performed, and a process shown in FIG. 8A is then performed.

Referring to FIG. 8A, the second metal oxide layer 230 and the second conductive layer 240 are selectively etched to form a second metal oxide layer pattern 230A and a second conductive layer pattern 240A in an island shape. At this time, a plurality of second metal oxide layer patterns 230A and second conductive layer patterns 240A may be arranged in a matrix when seen from the top of the substrate 200. During this process, the top of the first metal oxide layer 220 may be slightly etched.

Referring to FIG. 8B, impurities are implanted into sidewalls of the second metal oxide layer pattern 230A through a tilted ion implant process to convert an outer portion of the second metal oxide layer pattern 230A into an impurity-doped layer 250. At this time, the implanted impurities may include one or more of Si and Ge, and a heat treatment may be additionally performed to diffuse the impurities into the crystalline lattices of the second metal oxide layer pattern 230A.

Referring to FIG. 8C, the first conductive layer 210 and the first metal oxide layer 220 are etched to form a first conductive layer pattern 210A and a first metal oxide layer pattern 220A, using the second conductive layer pattern 240A as an etch mask. At this time, a plurality of first conductive layer patterns 210A and first metal oxide layer patterns 220A may be arranged in a matrix when seen from the top of the substrate 200.

Through the above-described fabrication method, the semiconductor device of FIG. 8C in accordance with the fifth embodiment may be fabricated.

Referring to FIG. 8C, the semiconductor device in accordance with the fifth embodiment may include the first conductive layer pattern 210A over the substrate 200, the second conductive layer pattern 240A spaced from the first conductive layer pattern 210A, the first and the second metal oxide layer patterns 220A and 230A interposed between the first and second conductive layer patterns 210A and 240A, and the impurity-doped layer 250 surrounding side surfaces of the second metal oxide layer pattern 230A.

The first and the second metal oxide layer patterns 220A and 230A may include a perovskite-based material or TMO having variable resistance characteristics. The first metal oxide layer pattern 220A may have a typical stoichiometric composition and the second metal oxide layer pattern 230A may have an oxygen-deficient stoichiometric material. Furthermore, the impurity-doped layer 250 is doped with one or more of Si and Ge, and has a higher electrical resistance value or a thermal resistance value than the second metal oxide layer pattern 230A. In particular, the impurity-doped layer 250 may have insulating properties.

The second metal oxide layer pattern 230A has a smaller width than the first metal oxide layer pattern 220A which is substantially the same width as the first and the second conductive layer patterns 210A and 240A. Thus, the impurity-doped layer 250 may be interposed between the first and the second conducive layer patterns 210A and 240A. The first conductive layer patterns 210A may be extended in parallel to each other in a first direction, and the second conductive layer patterns 240A may be extended in parallel to each other in a second direction crossing the first direction and the conductive layer patterns 21A.

FIGS. 9A and 9B are cross-sectional views for explaining the switching mechanism of the semiconductor device in accordance with the fifth embodiment.

Referring to FIG. 9A, when a set voltage is applied to the first and the second metal oxide layer patterns 220A and 230A through the first and the second conductive layer patterns 210A and 240A, current paths C are generated in the first and the second metal oxide layers 220A and 230A, and the memory cell MC is set to LRS. In this embodiment, since the impurity-doped layer 250 is not formed in the outer portion of the first metal oxide layer pattern 220A, a relatively large number of current paths C may be generated in the first metal oxide layer pattern 220A. However, one or a few current paths C exist in the second metal oxide layers 230A because the second metal oxide layer pattern 230A is formed narrower than the impurity-doped layer 250. In this case, the current paths C are created in a more uniform manner in a repeated set-reset operation, and the resistance value at LRS may be relatively reduced. Thus, a current ratio between LRS and HRS may be increased.

Referring to FIG. 9B, when a reset voltage is applied to the first and the second metal oxide layer patterns 220A and 230A through the first and the second conductive layer patterns 210A and 240A, the current paths C generated in the first and the second metal oxide layer patterns 220A and 230A are cut off, and the memory cell MC is set to HRS. At this time, since one or a few current paths C exist as described above, the current paths may be easily and rapidly cut off. Thus, a switching speed of the semiconductor device may be increased, and power consumption may be reduced. Furthermore, as a resistance value at HRS further increases, a current ratio between LRS and HRS may increase.

In embodiments described above, an impurity-doped layer (also referred to as a sidewall pattern) is formed by implanting dopants such as semiconductor elements into a sidewall of a variable resistance layer pattern. However, embodiments are not limited thereto, and the impurity-doped layer may be formed over a sidewall of the variable resistance layer pattern by another method.

In addition, in the above embodiments, a sidewall pattern formed over the sidewall of the variable resistance layer pattern is not limited to the impurity-doped layer which is formed by modifying the variable resistance layer. That is, any material such as an insulating material may be employed as an alternative to the variable resistance layer so long as the material has higher electrical resistance or a thermal resistance than the variable resistance layer.

Figure 10:
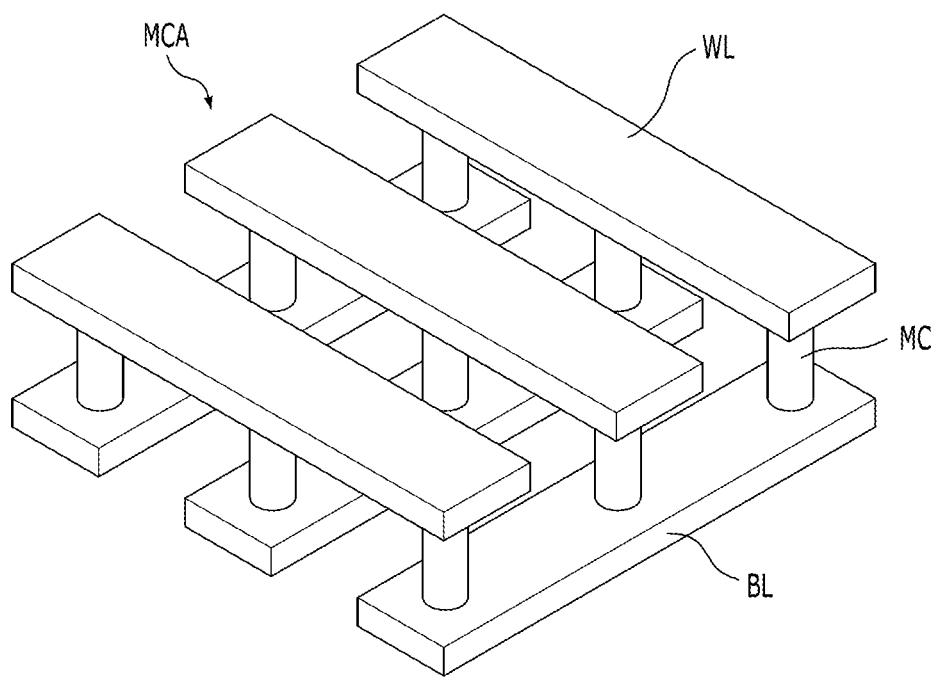
FIG. 10 is a perspective view of a memory cell array MCA of a semiconductor device in accordance with an embodiment.

FIG. 10 is a perspective view of a memory cell array MCA of a semiconductor device in accordance with an embodiment.

Referring to FIG. 10, the semiconductor device in accordance with the embodiment may form a cross point cell array which includes a plurality of bit lines BL extending in parallel to each other in a first direction, a plurality of word lines WL spaced from the bit lines BL and extending in parallel to each other in a second direction crossing the bit lines BL, and a plurality of memory cells MC arranged at respective intersections of the bit lines LB and the word lines WL. Each of the memory cells MC may include a variable resistance layer of which resistance is changed according to an applied voltage or current so as to switch between two or more resistance states, and an impurity-doped layer surrounding side surfaces of the variable resistance layer.

Figure 11:
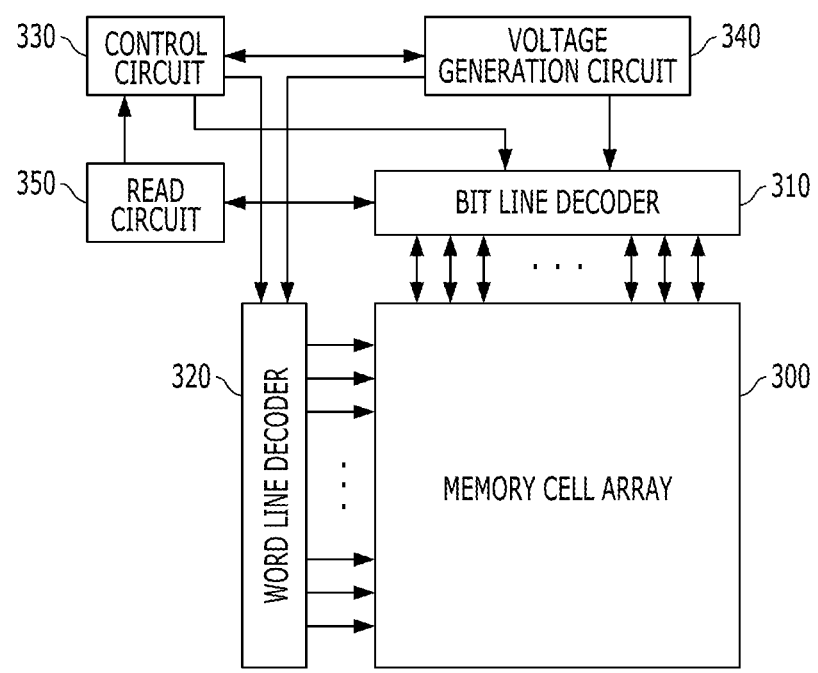
FIG. 11 is a diagram illustrating the configuration of a semiconductor device according to an embodiment.

FIG. 11 is a diagram illustrating the configuration of a semiconductor device according to an embodiment.

Referring to FIG. 11, a memory cell array 300 includes memory cells of a semiconductor device according to an embodiment, which are arranged in a matrix form. A bit line decoder 310, a word line decoder 320, a control circuit 330, a voltage generation circuit 340, and a read circuit 350 may be arranged in the neighborhood of the memory cell array 300.

The bit line decoder 310 is connected to each bit line of the memory cell array 300 to select a bit line that corresponds to an address signal. In the same manner, the word line decoder 320 is connected to each word line of the memory cell array 300 to select a word line that corresponds to an address signal. That is, a specific memory cell of the memory cell array 300 may be selected by the bit line decoder 310 and the word line decoder 320.

The control circuit 330 controls the bit line decoder 310, the word line decoder, and the voltage generation circuit 340 based on the address signal, a control input signal, and input data during write operation, and particularly controls write, erase, and read operations of the memory cell array 300. Further, the control circuit 330 may perform functions of a general address buffer circuit, a data input/output buffer circuit, and a control input buffer circuit.

The voltage generation circuit 340 generates voltages that are necessary during the write, erase, and read operations of the memory cell array 300, and supplies the generated voltages to the bit line and the word line. On the other hand, the read circuit 350 discriminates data stored therein through sensing the resistance state of the selected memory cell, and finally transfers the result of the discrimination to the control circuit 330.

Figure 12:
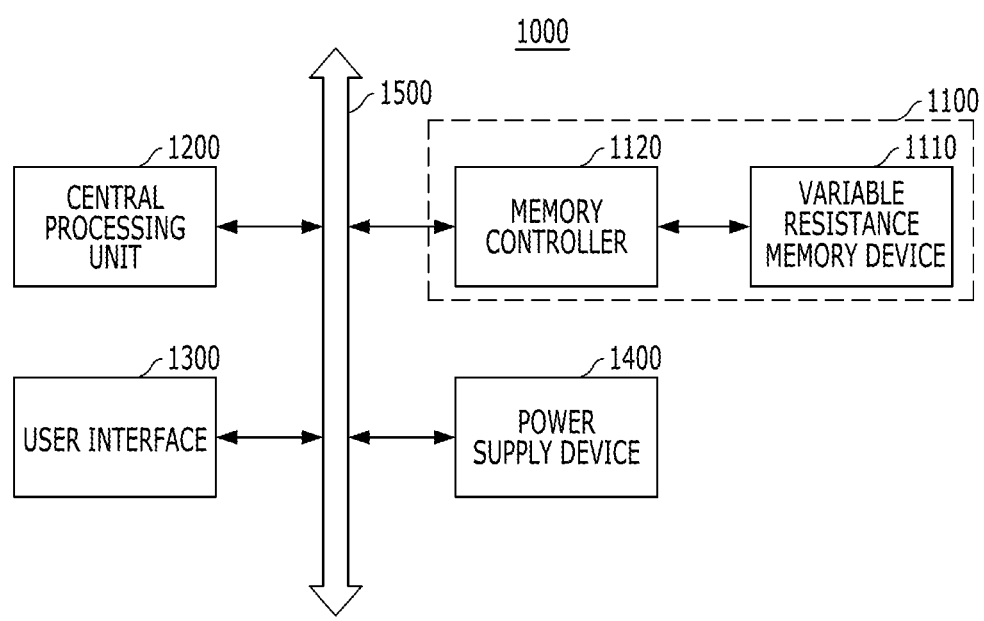
FIG. 12 is a diagram illustrating the configuration of an electronic device including a semiconductor device according to an embodiment.

FIG. 12 is a diagram illustrating the configuration of an electronic device including a semiconductor device according to an embodiment of the embodiments.

Referring to FIG. 12, an electronic device 1000 including a semiconductor device according to an embodiment of the embodiments may include a data storage system 1100, a central processing unit 1200, a user interface 1300, and a power supply device 1400 supplying power that is necessary for operations of the above-described constituent elements. The constituent elements can perform data communication with each other through a bus 1500. The electronic device 1000 is a device that can perform operations of input, processing, output, communication, and storage with respect to data. The electronic device 1000 may be a computer, a server, a tablet PC (Personal Computer), a portable computer, a PDA (Personal Digital Assistant), a wireless phone, a mobile phone, a smart phone, a digital music player, a PMP (Portable Multimedia Player), a camera, a GPS (Global Positioning System), a video camera, a voice recorder, telematics, an AV system (Audio Visual system), a smart TV (smart Television), or the like.

The data storage system 1100 may include a variable resistance memory device 1110 that can hold the stored data regardless of the power supply, and a memory controller 1120 controlling input/output of data stored in the variable resistance memory device 1110 in accordance with a command input from outside. The data storage system may be a HDD (Hard Disk Drive), a SSD (Solid State Drive), a USB (Universal Serial Bus) memory, a SD (Secure Digital) card, a mini SD (Secure Digital) card, a micro SD (Secure Digital) card, a SDHC (Secure Digital High Capacity) card, a memory stick, a CF (Compact Flash) card, a SM (Smart Media) card, a MMC (Multi-Media Card), an eMMC (Embedded MMC), or the like.

The variable resistance memory device 1110 may store data that is processed by the central processing unit 1200 or data that is input from outside through the user interface 1300, and may include one of the above-described semiconductor devices in accordance with the embodiments. For example, the variable resistance memory device 1110 may include a first conductive layer, a second conductive layer spaced from the first conductive layer, a variable resistance layer interposed between the first and second conductive layers, and an impurity-doped layer surrounding side surfaces of the variable resistance layer, and the variable resistance layer has a smaller width than the first and second conductive layers. On the other hand, the memory controller 1120 may control data exchange between the variable resistance memory device 1110 and the user interface 1300 in accordance with a command analyzed by the central processing unit 1200.

The central processing unit 1200 may perform analysis of a command input through the user interface 1300, and operation and comparison of data stored in the data storage system 1100. The central processing unit 1200 may include a MPU (Micro Processor Unit), a single/multi core processor, an AP (Application Processor), a GPU (Graphic Processing Unit), a DSP (Digital Signal Processor), and the like.

The user interface 1300 is to exchange commands and data between the electronic device 1000 and an external device, and may be a keypad, a keyboard, a mouse, a speaker, a microphone, various kinds of display devices, various kinds of HID (Human Interface Devices), or a communication device. The communication device may include a module that can connect the electronic device 1000 to a wired network or a module that can connect the electronic device 1000 to a wireless network.

Here, the module that can connect the electronic device 1000 to the wired network may include a LAN (Local Area Network), a USB (Universal Serial Bus), an Ethernet, PLC (Power Line Communication), and the like. The module that can connect to the wireless network may include IrDA (Infrared Data Association), CDMA (Code Division Multiple Access), FDMA (Frequency Division Multiple Access), a wireless LAN, WiBro (Wireless Broadband Internet), USN (Ubiquitous Sensor Network), RFID (Radio Frequency Identification), NFC (Near Field Communication), Zigbee, Bluetooth, LTE (Long Term Evolution), HSDPA (High Speed Downlink Packet Access), WCDMA (Wideband CDMA), UWB (Ultra WideBand), or the like.

In accordance with the embodiments, impurities are implanted into the sidewalls of the variable resistance layer so as to limit an area where the current paths are generated. In other words, an impurity-doped layer defines the area in a limited portion within a variable resistance layer. Thus, it is possible to increase nonlinearity while increasing uniformity of resistance switching characteristic, thereby improving reliability and performance of the semiconductor device. Furthermore, instead of various random paths, one or a few current paths are generated. Thus, a resistance switching speed may be increased, and power consumption of the semiconductor device may be reduced.

Although various embodiments have been described for illustrative purposes, various changes and modifications may be made without departing from the spirit and scope of the embodiments.

What is claimed is:

1. A semiconductor device comprising:
a first conductive layer;
a second conductive layer spaced from the first conductive layer;
a variable resistance layer provided between the first conductive layer and the second conductive layer; and
an impurity-doped layer provided over a side surface of the variable resistance layer,
wherein the variable resistance layer has a smaller width than a width of the first conductive layer and a width of the second conductive layer, and
wherein the variable resistance layer is formed of a metal oxide or a chalcogenide-based material, and the impurity-doped layer is formed of a metal oxide containing a semiconductor element or a chalcogenide-based material containing a semiconductor element.

2. The semiconductor device of claim 1, wherein the semiconductor element includes silicon or germanium.

3. The semiconductor device of claim 1, wherein the variable resistance layer is formed of the chalcogenide-based material, the impurity-doped layer is formed of the chalcogenide-based material containing the semiconductor element, and the impurity-doped layer has a thermal resistance value higher than a thermal resistance value of the variable resistance layer.

4. The semiconductor device of claim 1, wherein the impurity-doped layer is provided between the first conductive layer and the second conductive layer.

5. The semiconductor device of claim 1, wherein the metal oxide of the variable resistance layer has electric resistance changeable by migration of oxygen vacancies or ions and/or the chalcogenide-based material of the variable resistance layer has electric resistance changeable by a phase change.

6. The semiconductor device of claim 1,
wherein the metal oxide of the variable resistance layer includes a first metal oxide layer and a second metal oxide layer over or under the first metal oxide layer,
wherein the first metal oxide layer includes a typical stoichiometric composition, and
wherein the second metal oxide layer includes an oxygen-deficient stoichiometric material.

7. The semiconductor device of claim 1, the device further comprising a selecting element layer,
wherein the selecting element layer is provided between the first conductive layer and the variable resistance layer, or between the second conductive layer and the variable resistance layer.

8. The semiconductor device of claim 1, wherein the first conductive layer extends in a first direction, and
wherein the second conductive layer extends in a second direction and crosses the first conductive layer.

9. The semiconductor device of claim 1, wherein the variable resistance layer is formed of the metal oxide, the impurity-doped layer is formed of the metal oxide containing the semiconductor element, the semiconductor element is silicon, and the variable resistance layer includes silicate.

10. The semiconductor device of claim 1, wherein the variable resistance layer is formed of the chalcogenide-based material, the impurity-doped layer is formed of the chalcogenide-based material containing the semiconductor element, the semiconductor element is silicon, and the variable resistance layer includes silicide.

11. The semiconductor device of claim 1, wherein the impurity-doped layer and the chalcogenide-based material are doped with the semiconductor elements.

12. An electronic device comprising:
a variable resistance memory device configured to store data and maintain the stored data regardless of power supply; and
a memory controller configured to control input/output of the data stored in the variable resistance memory device according to a command inputted from outside,
wherein the variable resistance memory device comprises:
a first conductive layer;
a second conductive layer spaced from the first conductive layer;
a variable resistance layer provided between the first conductive layer and the second conductive layer; and
an impurity-doped layer provided over a side surface of the variable resistance layer, and
wherein a width of the variable resistance layer is smaller than a width of the first conductive layer and a width of the second conductive layer, and
wherein the impurity-doped layer is doped with a semiconductor element.

13. The electronic device of claim 12, wherein the semiconductor element is chosen from silicon and germanium.

* * * * *